(12) United States Patent
Kashiwagi et al.

(10) Patent No.: US 7,008,883 B2
(45) Date of Patent: Mar. 7, 2006

(54) PHOTORESIST COMPOSITION FOR FORMING AN INSULATION FILM, INSULATION FILM FOR ORGANIC ELECTROLUMINESCENCE DEVICES AND PROCESS FOR PRODUCING THE INSULATION FILM

(75) Inventors: Motofumi Kashiwagi, Yokosuka (JP); Noriyuki Mitao, Kawasaki (JP)

(73) Assignee: Zeon Corporation, Tokyo (JP)

( * ) Notice: Subject to any disclaimer, the term of this patent is extended or adjusted under 35 U.S.C. 154(b) by 216 days.

(21) Appl. No.: 10/381,432

(22) PCT Filed: Jun. 8, 2001

(86) PCT No.: PCT/JP01/04883

§ 371 (c)(1),
(2), (4) Date: Mar. 28, 2003

(87) PCT Pub. No.: WO02/29493

PCT Pub. Date: Apr. 11, 2002

(65) Prior Publication Data
US 2004/0096771 A1    May 20, 2004

(30) Foreign Application Priority Data
Sep. 29, 2000 (JP) .............................. 2000-298678

(51) Int. Cl.
  *H01L 21/31* (2006.01)
  *H01L 21/469* (2006.01)
  *G03C 5/00* (2006.01)
(52) U.S. Cl. ...................... 438/780; 438/781; 430/192; 430/319; 430/330
(58) Field of Classification Search ................ 438/758, 438/780, 781, 192, 319, 330
See application file for complete search history.

(56) References Cited

U.S. PATENT DOCUMENTS

| | | | | |
|---|---|---|---|---|
| 5,905,117 A * | 5/1999 | Yokotsuka et al. | ......... | 525/104 |
| 6,329,295 B1 * | 12/2001 | Matsubara et al. | ......... | 438/710 |
| 6,372,628 B1 * | 4/2002 | Matsubara et al. | ......... | 438/622 |
| 6,800,538 B1 * | 10/2004 | Furuhashi et al. | ......... | 438/476 |
| 6,819,041 B1 * | 11/2004 | Kajiwara | ..................... | 313/496 |
| 2003/0193624 A1 * | 10/2003 | Kobayashi et al. | ............ | 349/42 |

FOREIGN PATENT DOCUMENTS

| | | | |
|---|---|---|---|
| EP | 0430302 A2 | 6/1991 | |
| EP | 0520626 A1 | 12/1992 | |

(Continued)

OTHER PUBLICATIONS

European Search Report dated May 12, 2004.

*Primary Examiner*—Alexander Ghyka
(74) *Attorney, Agent, or Firm*—Armstrong, Kratz, Quintos, Hanson & Brooks, LLP (57) ABSTRACT

A photoresist composition comprising (A) a resin soluble in an alkali, (B) an ester of a quinonediazidesulfonic acid, (C) a thermosetting component and an organic solvent; an insulation film for organic EL devices which is formed by heating a resist film formed with the composition on a substrate in accordance with photolithography, has a sectional shape having upper edge portions having a round shape and the width increasing towards the bottom portion and has a thickness is in the range of 0.3 to 3 $\mu$m; and a process for producing the insulation film using the photoresist composition. The photoresist composition, the insulation film for organic EL devices and the process for producing the insulation film provide an insulation film having a sectional shape advantageous for an insulation film for organic EL devices since the width in the sectional shape of the film increases towards the bottom portion.

20 Claims, 2 Drawing Sheets

FOREIGN PATENT DOCUMENTS

| | | |
|---|---|---|
| JP | 4-352101 | 12/1992 |
| JP | 7-140648 | 6/1995 |
| JP | 09278849 | 10/1997 |
| JP | 09325210 | 12/1997 |
| JP | 2000-256565 | 9/2000 |
| JP | 2001-5175 | 1/2001 |

* cited by examiner

Figure 1

Light Emission

PHOTORESIST COMPOSITION FOR FORMING AN INSULATION FILM, INSULATION FILM FOR ORGANIC ELECTROLUMINESCENCE DEVICES AND PROCESS FOR PRODUCING THE INSULATION FILM

TECHNICAL FIELD

The present invention relates to a photoresist composition for forming an insulation film, an insulation film for organic electroluminescence devices (electroluminescence will be referred to as EL, hereinafter), a process for producing the insulation film and an organic EL device comprising the insulation film. More particularly, the present invention relates to a positive-type photoresist composition used for forming an insulation film for organic EL devices having a sectional shape having the width increasing towards the bottom portion, an insulation film for organic EL devices which is formed by using the photoresist composition and has a sectional shape having the width increasing towards the bottom portion, a process for efficiently producing the insulation film with the above photoresist composition, and an organic EL device comprising the insulation film having a sectional shape having the width increasing towards the bottom portion.

BACKGROUND ART

EL devices which utilize light emission under application of an electric field show high self-distinguishability due to the self-emission and exhibit excellent impact resistance since they are completely solid devices. Therefore, EL devices have been attracting attention for application as light emitting devices in various types of display apparatus.

The EL devices include inorganic EL devices in which an inorganic compound is used as the light emitting material and organic EL devices in which an organic compound is used as the light emitting material. Organic EL devices have been extensively studied for practical application as a light emitting device of the next generation since the applied voltage can be decreased to a great extent, the size of the device can be reduced easily, consumption of electric power is small, planar light emission is possible and three primary colors are easily emitted.

As for the construction of the organic EL device, the basic construction comprises a transparent electrode layer (an anode), a layer of a thin film of an organic light emitting material (an organic light emitting layer) and a metal electrode layer (a cathode), which are successively formed on a transparent substrate. Constructions having a hole injecting and transporting layer or an electron injecting layer suitably added to the basic construction are known. Examples of such constructions include the construction of an anode/a hole injecting and transporting layer/an organic light emitting layer/a cathode and the construction of an anode/a hole injecting and transporting layer/an organic light emitting layer/an electron injecting layer/a cathode. The hole injecting and transporting layer has the function of transporting holes injected from the anode. The electron injecting layer has the function of transporting electrons injected from the cathode to the light emitting layer. It has been known that, due to the hole injecting and transporting layer disposed between the light emitting layer and the anode, a greater amount of holes are injected into the light emitting layer under a lower electric field and electrons injected into the light emitting layer from the cathode or the electron injecting layer are accumulated at the interface between the hole injecting and transporting layer and the light emitting layer to increased the efficiency of the light emission since the hole injecting and transporting layer does not transport electrons.

Figure 1:
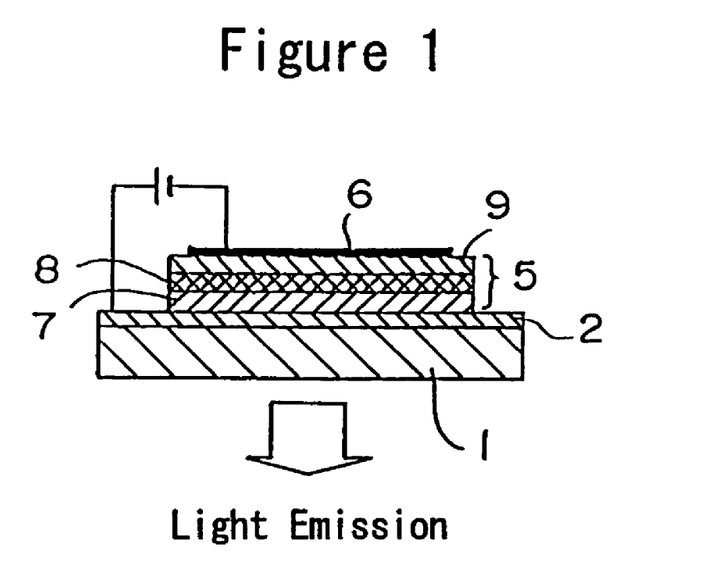
FIG. 1 shows a diagram exhibiting the principle of an example of the organic EL device.

FIG. 1 shows a diagram exhibiting the principle of an example of the organic EL device. As shown in this Figure, an organic EL device has, in general, a construction in which an organic EL material layer 5 comprising a hole injecting and transporting layer 7, an organic light emitting layer 8 and an electron injecting layer 9 is laminated to a transparent electrode (the anode) 2 disposed on a transparent substrate 1 and a metal electrode layer (the cathode) 6 is further laminated to the organic EL material layer 5. When an electric current is applied between the anode and the cathode, light is generated in the organic light emitting layer 8 and emitted to the outside through the transparent substrate in the above construction.

For preparing the organic EL device, a patterned transparent electrode (the anode) is formed on a transparent substrate such as a glass plate in accordance with the vapor deposition or the sputtering and an insulation film having a desired pattern is formed on the formed transparent electrode. The insulation film can be formed, for example, in accordance with the etching of a film of a polyimide resin or the lithography using a photoresist. The insulation film may be used also as the light-shielding film.

On the insulation film formed on the transparent substrate, a resist pattern layer having a rectangular sectional shape or a undercut pattern profile is formed in accordance with the lithography. The formed resist pattern layer can be used as a resin separation layer and a plurality of such layers may be formed. For example, a hole injecting and transporting layer, an organic light emitting layer and an electron injecting layer are successively formed between the resin separation layers in accordance with the vacuum vapor deposition so that an organic EL material layer is formed. A metal electrode layer (the cathode) is further laminated on the formed organic EL material layer and a light emitting portion is formed. A sealing layer is formed on the light emitting portion in the final step and a sealed organic EL device is obtained.

Figure 2:
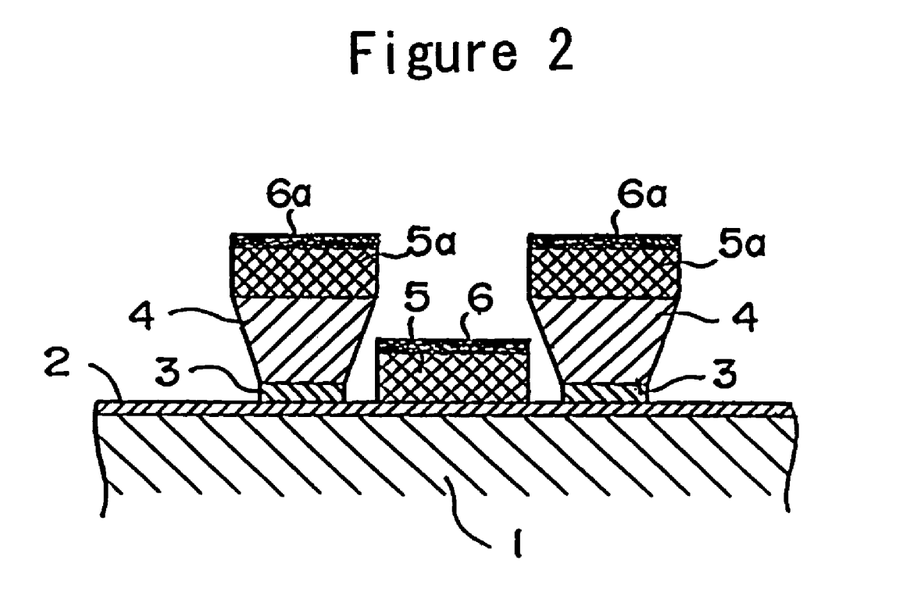
FIG. 2 shows a partial sectional view exhibiting the construction of an example of the light emitting portion in a conventional organic EL device.

FIG. 2 shows a partial sectional view exhibiting the construction of an example of the light emitting portion in a conventional organic EL device. On a transparent substrate 1 having a patterned transparent electrode 2, resist pattern layers (resin separation layers) 4 having an undercut pattern profile is disposed via insulation films 3. Between the resist pattern layers, an organic EL material layer 5 (having a construction constituted with a hole injecting and transporting layer, an organic light emitting layer and an electron injecting layer which are formed successively from the side of the transparent electrode layer) having a metal electrode layer 6 on the surface is disposed. Thus, a light emitting portion is formed independently without contacting the resist pattern layers 4. On the resist pattern layer 4, an organic EL material layer 5a having a metal electrode layer 6a on the surface is formed due to convenience in the preparation although the organic EL material layer 5a is not necessary from the standpoint of the function.

The insulation film 3 in the organic EL device having the construction described above has, in general, a rectangular sectional shape as shown in FIG. 2. However, in the formation of the organic EL material layer on the transparent electrode 2 between the resin separation layers 4 and the light emitting portion by laminating a metal electrode (the cathode) on the organic EL material layer in accordance with the vacuum vapor deposition, it is difficult that the side faces of a light emitting portion are formed in a vertically flat shape due to the characteristic of the vacuum vapor deposition when the sectional shape of the insulation film is rectangular. Occasionally, the light emission becomes uneven due to the extended deposition of the metal electrode material on the side faces during the vapor deposition of the metal electrode layer or short circuit takes place due to attachment of the metal electrode material to the transparent electrode. Therefore, a problem arises in that the frequency of the formation of defect products increases.

To overcome the above problem, it is considered that a sectional shape having upper edge portions having a round shape and a width increasing towards the bottom portion is advantageous. When the insulation film has the sectional shape described above, the extended deposition of the metal electrode material on the side faces is suppressed during the vapor deposition.

In accordance with a recently developed technology, a pattern is formed with a plurality of holes having a transparent electrode layer exposed at the bottom portion, a polymer organic EL material is injected through nozzles into the holes in accordance with the ink-jet process to form organic EL material layers in the holes, and a metal electrode layer is laminated on the formed layers to prepare an organic EL device. In this technology, banks composed of an insulation film (which also works as the light-shielding film) is disposed between the holes. For this insulation film, the sectional shape having upper edge portions having a round shape and a width increasing towards the bottom portion is considered to be more advantageous than the rectangular sectional shape.

Under the above situation, the present invention has an object of providing a photoresist composition which is advantageously used as the insulation film for organic EL devices and provides an insulation film having the sectional shape having upper edge portions having a round shape and the width increasing towards the bottom portion, an insulation film for organic EL devices which is obtained by using the above composition and has the sectional shape having the width increasing towards the bottom portion, a process for efficiently producing the insulation film and an organic EL device having the insulation film having the sectional shape having the width increasing towards the bottom portion.

DISCLOSURE OF THE INVENTION

As the result of intensive studies by the present inventors to achieve the above object, it was found that a positive-type photoresist composition comprising a thermosetting component which was cured at a specific temperature was suitable for the object of forming the insulation film having the sectional shape having upper edge portions having a round shape and the width increasing towards the bottom portion, and that an insulation film for organic EL devices having the desired sectional shape having the width increasing towards the bottom portion could be obtained by forming a resist film having a desired pattern with the above composition in accordance with the photolithography, followed by heating the formed resist film at a specific temperature. The present invention has been completed based on this knowledge.

The present invention provides:

(1) A photoresist composition for forming an insulation film for organic electroluminescence devices which comprises (A) a resin soluble in an alkali, (B) an ester of a quinonediazidesulfonic acid, (C) a thermosetting component which is cured at a temperature higher than a temperature of heat resistance of a resist film formed with the composition in accordance with photolithography, and an organic solvent;

(2) A photoresist composition for forming an insulation film described in (1), wherein the thermosetting component of component (C) is a thermosetting imide resin represented by general formula [1]:

wherein R represents a group expressed by:

representing an integer of 3 to 8;

(3) A photoresist composition for forming an insulation film described in any one of (1) and (2), which comprises 1 to 20 parts by weight of component (C) per 100 parts by weight of component (A);

(4) An insulation film for organic electroluminescence devices which is formed by heating a resist film having a desired pattern and formed with a composition described in any one of (1), (2) and (3) on a substrate in accordance with photolithography, has a sectional shape having upper edge portions having a round shape and a width increasing towards a bottom portion and has a thickness in a range of 0.3 to 3 $\mu$m;

(5) A process for producing an insulation film for organic electroluminescence devices described in (4), the process comprising forming a resist film having a substantially rectangular sectional shape and a desired pattern with a photoresist composition described in any one of (1), (2) and (3) on a substrate in accordance with photolithography and heating the formed resist film at a temperature higher than a temperature of heat resistance of the resist film so that the thermosetting component in the resist film is cured; and (6) An organic electroluminescence device which comprises an insulation film described in (4).

BRIEF DESCRIPTION OF THE DRAWINGS

In the Figures, 1 means a transparent substrate, 2 means a transparent electrode layer, 3 and 3' mean insulation films, 4 means a resist pattern layer having a undercut pattern profile, 5 and 5a mean organic EL material layers, 6 and 6a mean metal electrode layers, 7 means a hole injecting and transporting layer, 8 means an organic light emitting layer and 9 means an electron injecting layer.

THE MOST PREFERRED EMBODIMENT TO CARRY OUT THE INVENTION

The photoresist composition for forming an insulation film of organic EL devices of the present invention (this composition will be occasionally referred to as the photoresist composition of the present invention) will be described in the following.

The photoresist composition of the present invention is a photoresist composition comprising (A) a resin soluble in an alkali, (B) an ester of a quinonediazidesulfonic acid, (C) a thermosetting component and an organic solvent.

The resin soluble in an alkali of component (A) is not particularly limited and a suitable resin can be selected as desired from resins soluble in an alkali which are conventionally used for positive-type photoresists comprising esters of quinonediazidesulfonic acids as the photosensitive agent. Examples of the resin soluble in an alkali include condensation products of phenols and aldehydes or ketones (novolak resins), vinylphenol-based polymers, isopropenylphenol-based polymers and hydrogenation products of these phenol resins. Examples of the phenol used as the material for the condensation products of phenols and aldehydes or ketones include monohydric phenols such as phenol, o-cresol, m-cresol, p-cresol, 2,3-xylenol, 2,4-xylenol, 3,5-xylenol, 2,6-xylenol, 2,3,4-trimethylphenol, 2,3,5-trimethylphenol, o-ethyl-phenol, m-ethylphenol, p-ethylphenol, o-propylphenyl, m-propylphenol, p-propylphenol, o-butylphenol, m-butylphenol, p-butylphenol, o-phenyl-phenol, m-phenylphenol, p-phenylphenol, o-methoxyphenol, m-methoxy-phenol, p-methoxyphenol and 3-methylmethoxyphenol; and polyhydric phenols such as resorcinol, pyrocatechol, hydroquinone, bisphenol A, phloroglucinol and pyrogallol.

Examples of the aldehyde include formaldehyde, paraformaldehyde, benzaldehyde, hydroxybenzaldehyde, terephthalaldehyde, acetaldehyde and hydroxyacetaldehyde. Examples of the ketone include acetone, methyl ethyl ketone, diethyl ketone and diphenyl ketone.

The condensation product can be obtained in accordance with a conventional process, for example, comprising reacting a phenol and an aldehyde or a ketone in the presence of an acidic catalyst.

The vinylphenol-based polymers are selected from the homopolymer of vinylphenol and copolymers of vinylphenol with components copolymerizable with vinylphenol. The isopropenylphenol-based polymers are selected from the homopolymer of isopropenylphenol and copolymers of isopropenylphenol with components copolymerizable with isopropenylphenol. Examples of the component copolymerizable with vinylphenol or isopropenylphenol include acrylic acid, methacrylic acid, styrene, maleic anhydride, maleimide, vinyl acetate, acrylonitrile and derivatives of these compounds. The copolymers can be obtained in accordance with a conventional process.

The hydrogenation product of the phenol resin can be obtained in accordance with a conventional process such as the process comprising dissolving the above phenol resin into an organic solvent, followed by hydrogenating the dissolved resin in the presence of a homogeneous catalyst or a heterogeneous catalyst.

The resin soluble in an alkali having the molecular weight and the molecular weight distribution controlled by a conventional means can also be used. Examples of the means for controlling the molecular weight and the molecular weight distribution include pulverizing the resin, followed by subjecting to the solid-liquid extraction with an organic solvent having a suitable solubility; dissolving the resin into a good solvent, followed by adding the resultant solution dropwise into a poor solvent; and adding a poor solvent to the resin, followed by subjecting the resulting product to the solid-liquid extraction or the liquid-liquid extraction.

The resin soluble in an alkali of component (A) may be used singly or in combination of two or more. In the present invention, phenol-based novolak resins soluble in an alkali obtained by polycondensation of a phenol and an aldehyde in the presence of an acid catalyst are preferable among the above resins soluble in an alkali. Cresol novolak resins soluble in an alkali obtained by using a mixed cresol comprising m-cresol and p-cresol as the phenol are more preferable.

In the present invention, it is advantageous that the resin soluble in an alkali of component (A) is selected so that the resist film formed by using the photoresist composition comprising the resin in accordance with the photolithography has a thermal property such that the temperature of heat resistance is, in general, in the range of 90 to 130° C. and preferably in the range of 95 to 125° C.

The temperature of heat resistance is the value measured in accordance with the following method.

A photoresist composition is applied to a silicon wafer and dried and a resist film having a thickness of 1.2 $\mu$m is formed. A pattern of lines and spaces of 10 $\mu$m is formed through a mask. The resultant product is heated for 5 minutes on a hot plate, and the width of the lines is measured. The temperature at which the width of the lines exceeds 120% of the width before being heated is used as the temperature of heat resistance.

In the photoresist composition of the present invention, the ester of a quinonediazidesulfonic acid used as component (B) is not particularly limited and a suitable compound can be selected as desired from esters of quinonediazidesulfonic acids conventionally used as the photosensitive agent. Examples of the ester of a quinonediazidesulfonic acid include compounds obtained by converting a specific fraction of the phenolic hydroxyl group in polyphenol compounds into esters of 1,2-naphthoquinonediazide-5-sulfonic acid, esters of 1,2-naphthoquinonediazide-4-sulfonic acid, esters of 1,2-naphthoquinonediazide-6-sulfonic acid, esters of 1,2-benzoquinonediazide-5-sulfonic acid and esters of 1,2-benzoquinonediazide-4-sulfonic acid. Among these compounds, esters of 1,2-naphthoquinonediazide-5-sulfonic acid and esters of 1,2-naphthoquinonediazide-4-sulfonic acid are preferable and esters of 1,2-naphthoquinonediazide-4-sulfonic acid are more preferable. A resist composition exhibiting an excellent balance between the sensitivity and the resolution can be provided by using the ester of 1,2-naphthoquinonediazide-4-sulfonic acid.

The polyphenol used for the above compounds is a compound having two or more, preferably three or more and more preferably four or more phenolic hydroxyl groups. Examples of the polyphenol include polyhydroxybenzophenones such as 2,3,4-trihydroxybenzophenone, 2,4,4'-trihydroxybenzophenone, 2,3,4,4'-tetrahydroxybenzophenone, 2,4,2', 4'-tetrahydroxybenzophenone and 2,3,4,2', 4'-pentahydroxybenzophenone; polyhydroxytrisphenylalkanes such as tris(4-hydroxyphenyl)methane, 1,1,1-tris(4-hydroxy-3-methylphenyl)ethane, 1,1,1 -tris(4-hydroxyphenyl) ethane, 1,1-bis(4-hydroxy-3-methylphenyl)-1-(4-hydroxyphenyl)ethane and bis(4-hydroxy-3-methylphenyl)-2-hydroxy-4-methoxyphenylmethane; trimers of phenols and formaline; tetramers of phenols and formaline; and novolak resins. The polyphenol is not limited to the compounds described as the examples.

The process for preparing the ester is not particularly limited. The ester can be obtained by reacting the quinonediazidesulfonic acid halide and preferably the quinonediazidesulfonic acid chloride with the polyphenol compound in accordance with a conventional process in a solvent such as acetone, dioxane and tetrahydrofuran in the presence of an inorganic base such as sodium carbonate, sodium hydrogencarbonate, sodium hydroxide and potassium hydroxide or an organic base such as trimethylamine, triethylamine, tripropylamine, diisopropylamine, tributylamine, pyrrolidine, piperidine, piperadine, morpholine, pyridine and dicyclohexylamine.

In the ester used in the present invention, the fraction of hydroxyl group of the polyphenol converted into the ester of a quinonediazidesulfonic acid (the average fraction of esterification) is the value calculated from the amount by equivalent of hydroxyl group of the polyphenol and the amount by mole of the quinonediazidesulfonic acid halide used for the reaction. The average fraction of esterification is, in general, 60% or greater and preferably 65% or greater. The upper limit of the average fraction of esterification is, in general, 100% and preferably 90%. When the average fraction is 60% or greater, the shape of the pattern and the resolution can be improved.

In the present invention, the ester of a quinonediazidesulfonic acid of component (B) may be used singly or in combination of two or more. It is advantageous that the content of the ester of 1,2-naphthoquinone-diazide-5-sulfonic acid is controlled at 20% by weight or smaller and preferably at 10% or smaller in the entire photosensitive agents.

In the photoresist composition of the present invention, the content of the ester of a quinonediazidesulfonic acid of component (B) is selected, in general, in the range of 1 to 50 parts by weight and preferably in the range of 10 to 30 parts by weight per 100 parts by weight of the resin soluble in an alkali of component (A). When the content of component (B) is in the above range, the photoresist exhibiting an excellent balance between the properties of the resist such as the effective sensitivity, the fraction of the residual film and the resolution can be obtained.

As the thermosetting component of component (C) in the photoresist composition of the present invention, a thermosetting component which is cured at a temperature higher than the temperature of heat resistance of a resist film formed with the composition in accordance with photolithography is used. When the curing temperature of the thermosetting component is lower than the temperature of heat resistance of the resist film, the insulation film having the desired sectional shape having the width increasing towards the bottom portion cannot be obtained. It is preferable that the temperature of the start of the curing is higher than the temperature of heat resistance of the resist film by 5° C. or greater and more preferably by 10° C. or greater. When the temperature of the start of the curing is excessively higher than the temperature of heat resistance of the resist film, the width of the sectional shape increases excessively towards the bottom portion and an insulation film having the desired sectional shape cannot be obtained. Therefore, it is preferable that the temperature of the start of the curing is higher than the temperature of heat resistance of the resist film by 50° C. or lower and more preferably by 30° C. or lower.

The thermosetting component of component (C) is not particularly limited as long as the component has the temperature of the start of the curing within the above range and the insulating property of the obtained film is not adversely affected. Various thermosetting compounds such as epoxy resins, guanamine resins, phenol resins, unsaturated polyester resins, imide resins, polyurethanes, maleic acid resins, melamine resins and urea resins can be used. Among these compounds, imide resins are preferable and thermosetting imide resins are more preferable. Examples of the thermosetting imide resin include bisallylnadimides represented by general formula [1]:

[1]

wherein R represents a group expressed by:

representing an integer of 3 to 8. The bisallylnadimide is cured by heating and exhibits excellent heat resistance.

The thermosetting component of component (C) may be used singly or in combination of two or more. The content of component (C) in the photoresist composition is selected, in general, in the range of 1 to 20 parts by weight and preferably in the range of 3 to 15 parts by weight per 100 parts by weight of the resin soluble in an alkali of component (A) from the standpoint of the effect.

To provide the formed insulation film with the function of the light-shielding film, where desired, the photoresist composition of the present invention may further comprise at least one light-shielding material selected from carbon black, chromium oxide, iron oxide, titanium black, aniline black, black organic pigments and mixed organic pigments having quasi-black color obtained by mixing at least two organic pigments selected from red, blue, green, violet, yellow, cyan and magenta.

It is preferable that the light-shielding material is contained in the photoresist composition in an amount of 20 to 80% by weight. Among the above light-shielding materials, titanium black is preferable from the standpoint of the light-shielding property.

To enhance the sensitivity, where desired, the photoresist composition of the present invention may further comprise phenol compounds such as polyhydroxybenzophenones described above, 1-[1-(4-hydroxyphenyl)isopropyl]-4-[1,1-bis(4-hydroxyphenyl)ethyl]benzene, tris(hydroxyphenyl) methanes and these compounds having methyl group as the substituent; mercaptoxazole; mercaptobenzoxazole; mercaptoxazoline; mercaptobenzothiazole; benzoxazoline; benzothiazolone; mercaptobenzimidazole; urazole; thiourazole; mercaptopyrimidine; imidazolone; and derivatives of these compounds.

As the auxiliary agent for improving the resolution and the fraction of the residual film, the photoresist composition of the present invention may further comprise isocyanurate-based compounds. Examples of the isocyanurate-based compound include 1,3,5-tris(4-tert-butyl-3-hydroxy-2,6-dimethylbenzyl)isocyanurate, 1,3,5-tris(4-tert-butyl-3-hydroxy-2,6-diethylbenzyl) isocyanurate and 1,3,5-tris(3,5-di-tert-butyl-4-hydroxybenzyl) isocyanurate.

Where necessary, the photoresist composition of the present invention may further comprise additives compatible with the composition such as additional resins, plasticizers, stabilizers and surfactants which are conventionally used for improving the properties of the resist film.

The organic solvent used in the resist composition is not particularly limited and a conventional solvent for photoresists can be used. Examples of the organic solvent include linear chain ketones such as acetone, methyl ethyl ketone, cyclopentanone, 2-hexanone, 3-hexanone, 2-heptanone, 3-heptanone, 4-heptanone, 2-octanone, 3-octanone and 4-octanone; alcohols such as n-propyl alcohol, isopropyl alcohol, n-butyl alcohol and cyclohexanol; ethers such as ethylene glycol dimethyl ether, ethylene glycol diethyl ether and dioxane; alcohol ethers such as ethylene glycol monomethyl ether and ethylene glycol monoethyl ether; esters such as propyl formate, butyl formate, propyl acetate, butyl acetate, methyl propionate, ethyl propionate, methyl butyrate, ethyl butyrate, methyl lactate and ethyl lactate; cellosolve esters such as cellosolve acetate, methylcellosolve acetate, ethylcellosolve acetate, propylcellosolve acetate and butylcellosolve acetate; propylene glycols such as propylene glycol, propylene glycol monomethyl ether, propylene glycol monomethyl ether acetate, propylene glycol monoethyl ether acetate and propylene glycol monobutyl ether; diethylene glycols such as diethylene glycol monomethyl ether, diethylene glycol monoethyl ether, diethylene glycol dimethyl ether, diethylene glycol diethyl ether and diethylene glycol methyl ethyl ether; saturated γ-lactones such as γ-butyrolactone, γ-valerolactone, γ-caprolactone and γ-caprylolactone; halogenated hydrocarbons such as trichloroethylene; aromatic hydrocarbons such as toluene and xylene; and polar solvents such as dimethylacetamide, dimethylformamide and N-methylacetamide. The solvent may be used singly or in combination of two or more. The amount of the solvent is not particularly limited as long as the amount is sufficient for homogeneously dissolving or uniformly dispersing the components described above.

The insulation film for organic EL devices of the present invention is an insulation film which is formed by heating a resist film having a desired pattern and formed with the photoresist composition described above on a substrate in accordance with photolithography and has a sectional shape having upper edge portions having a round shape and the width increasing towards the bottom portion. It is preferable that the area of the portion of the pattern contacting the substrate obtained after being heated is 140% or smaller of the corresponding area before being heated. When the downward increase in the sectional width [the area of the portion contacting the substrate relative to the corresponding area before being heated, (%)] exceeds 140%, the insulation film having the desired shape and the desired thickness is not obtained, occasionally. When the downward increase in the sectional width is small and the sectional shape before being heated is a rectangle or close to a rectangle, the desired sectional shape having the width increasing towards the bottom portion is not obtained, occasionally. From the standpoints described above, it is preferable that the downward increase in the sectional width is greater than 100% and 140% or smaller and more preferably in the range of 102 to 130%.

The thickness of the insulation film is, in general, in the range of 0.3 to 3 $\mu$m, more preferably in the range of 0.5 to 2 $\mu$m and most preferably in the range of 1 to 1.5 $\mu$m.

Figure 3:
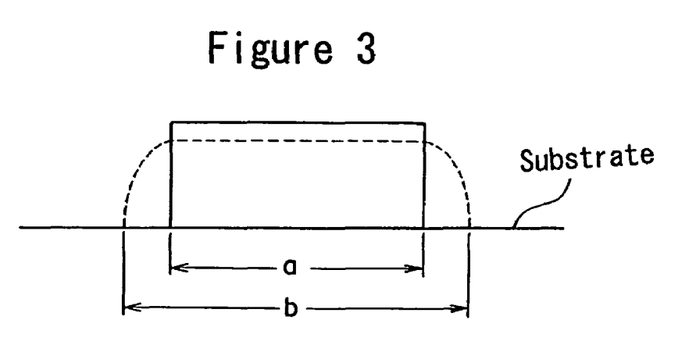
FIG. 3 shows a diagram exhibiting an example of the change in the shape when the resist film formed in accordance with the photolithography is heated in the preparation of the insulation film of the present invention.

FIG. 3 shows a diagram exhibiting an example of the change in the shape when the resist film formed in accordance with the photolithography is heated in the preparation of the insulation film of the present invention. The portion surrounded by the solid line shows a front view of the resist film having a rectangular sectional shape. The portion surrounded by the broken line shows a front view of the insulation film of the present invention obtained after heating the above resist film. The downward increase in the sectional width is given by $100 \times (b/a)^2$.

As the substrate on which the insulation film for organic EL devices of the present invention is formed, a transparent substrate having a patterned transparent electrode layer (the anode) can be used.

As the transparent substrate, a flat and smooth substrate having a transmittance of light in the visible region of 400 to 700 nm of 50% or greater is preferable. Examples of the transparent substrate include glass plates and polymer plates. Examples of the glass plate include plates of soda lime glass, glass containing barium and strontium, lead glass, aluminosilicate glass, borosilicate glass, barium borosilicate glass and quartz. Examples of the polymer plate include plates of polycarbonates, acrylic resins, polyethylene terephthalate, polyether sulfite and polysulfone. Among these transparent substrates, in general, glass plates are preferable.

As the anode, a transparent electrode using a metal, an alloy, an electrically conductive compound or a mixture of these materials which has a great work function (4 eV or greater) as the electrode material is preferable. It is preferable that the sheet resistance of the anode is several hundred $\Omega/cm^2$ or smaller. Examples of the anode include electrodes using an electrically conductive material such as ITO (indium tin oxide), $SnO_2$, ZnO and In—Zn—O as the electrode material. For forming the anode, the electrode material is formed into a thin film in accordance with the vapor deposition or the sputtering. The thickness of the anode is selected, in general, in the range of 10 nm to 1 mm and preferably in the range of 10 to 200 nm although the thickness depends on the type of the material.

The insulation film for organic EL devices of the present invention described above can be efficiently produced in accordance with the process of the present invention shown in the following.

In the process of the present invention, a resist film having a substantially rectangular sectional shape and a desired pattern is formed with the photoresist composition described above on a substrate which is specifically a transparent substrate having a patterned transparent electrode layer (the anode) in accordance with the photolithography. The formed resist film is heated at a temperature higher than the temperature of heat resistance of the resist film so that the thermosetting component of component (C) in the resist film is cured. The insulation film for organic EL devices of the present having a sectional shape which has upper edge portions having a round shape and the width increasing towards the bottom portion can be obtained in this manner.

The process for producing the insulation film will be described specifically in the following.

A transparent substrate having a patterned transparent electrode layer (the anode) is coated with the photoresist composition described above using a spinner or the like and the formed coating layer is dried to form a photoresist layer. The thickness of the photoresist layer is controlled so that the completed insulation film has the prescribed thickness. The resultant laminate is irradiated with ultraviolet light, deep UV or excimer laser beams by an apparatus for exposure with demagnified projection via a desired mask pattern or is subjected to the pattern drawing with electron beams. The treated laminate is then heated. The heated laminate is developed with a developing liquid such as an alkaline aqueous solution which is, for example, a 1 to 10% by weight aqueous solution of tetramethylammonium hydroxide and a resist film having the desired pattern and a substantially rectangular sectional shape is formed.

The resist film formed as described above is heated at a temperature higher than the temperature of heat resistance of the resist film by preferably 5° C. or greater and more preferably by 10° C. or greater so that the thermosetting component in the resist film is cured. It is important that the temperature of the heating is controlled in accordance with the temperature of heat resistance of the resist film and the temperature of starting the curing of the thermosetting component so that the insulation film having a sectional shape having upper edge portions having a round shape and the width increasing towards the bottom portion is formed.

It is preferable that the temperature of heat resistance of the resist film is in the range of 90 to 130° C. and more preferably in the range of 95 to 125° C. When the temperature of heat resistance of the resist film is in the above range and a thermosetting imide resin such as bisallylnadimide is used as the thermosetting component, it is preferable that the temperature of heating the resist film is in the range of 140 to 250° C. and more preferably in the range of 150 to 200° C. The time of the heating is varied depending on the temperature of the heating and cannot be generally decided. In general, the time of the heating in the range of about 60 to 30 seconds is sufficient.

The insulation film for organic EL devices of the present invention can be efficiently obtained as described above. Since the resist film has been treated by heating at a high temperature, volatile components in the film have been removed almost completely and do not adversely affect the organic EL device.

The present invention also provides the organic EL device having the resist film prepared as described above.

An embodiment of the process for producing the organic EL device of the present invention will be described in the following.

As described above, a resist pattern layer is formed in accordance with a conventional process via the insulation film of the present invention which is formed on the transparent substrate having the patterned transparent electrode (the anode) and has the sectional shape having the width increasing towards the bottom portion. The resist pattern layer may have a rectangular sectional shape or a undercut pattern profile.

When the resist pattern layer having a rectangular sectional shape is formed, the photoresist used for forming the layer may be any of the non-chemical amplification type and the chemical amplification type and may be any of the positive type and the negative type. Examples of the photoresist include (1) positive-type photoresists of the non-chemical amplification type which comprise a novolak resin soluble in an alkali and a compound having quinonediazide group as the essential components, (2) positive-type photoresists of the chemical amplification type which comprise a resin exhibiting change in solubility in an alkali by the action of an acid and a compound generating an acid by irradiation with a radiation as the essential components, and (3) negative type photoresists of the chemical amplification type which comprise a resin soluble in an alkali, a substance crosslinked with an acid and a compound generating an acid by irradiation with a radiation as the essential components.

When the resist pattern layer having a undercut pattern profile is formed, a photoresist such as that described in Japanese Patent No. 2989064 can be used. Examples of this photoresist include a negative type photoresist which comprises at least one of (A) a component crosslinked by exposure to light or by exposure to light, followed by a heat treatment, (B) a resin soluble in an alkali and (C) a compound which absorbs the light used for the exposure, and is developed by an alkaline aqueous solution.

The process for forming the resist pattern layer using the above photoresist is not particularly limited and the resist pattern layer having the rectangular sectional shape or the undercut pattern profile can be formed in accordance with the conventional lithography. The thickness of the resist pattern layer is, in general, about 0.5 to several $\mu$m.

After the resist pattern layer is formed on the transparent substrate having the patterned transparent electrode layer via the insulation film of the present invention as described above, a hole injecting and transporting layer is formed in accordance with the vacuum vapor deposition. The conditions for the vacuum vapor deposition are different depending on the used compound (the material of the hole injecting and transporting layer) and the crystal structure and the recombination structure of the hole injecting and transporting layer to be formed. In general, it is preferable that the conditions are suitably selected in the following ranges: the temperature of the source of vapor deposition: 50 to 450° C.; the degree of vacuum: $1 \times 10^{-5}$ to $1 \times 10^{-1}$ Pa; the rate of vapor deposition: 0.01 to 50 nm/sec; the temperature of the substrate: −50 to 300° C.; and the thickness of the layer: 5 nm to 1 $\mu$m.

In the next step, an organic light emitting layer is formed on the hole injecting and transporting layer in accordance with the vacuum vapor deposition. In general, the conditions for the vacuum vapor deposition can be selected in the same ranges as those described for the formation of the hole injecting and transporting layer although the conditions are different depending on the compounds used for the vacuum vapor deposition. It is preferable that the thickness of the layer is in the range of 10 to 40 nm.

On the light emitting layer thus formed, an electron injecting layer is formed in accordance with the vacuum vapor deposition. The conditions for the vacuum vapor deposition can be selected in the same ranges as those described for the formation of the hole injecting and transporting layer and the formation of the light emitting layer. It is preferable that the thickness of the layer is in the range of 5 nm to 1 μm.

As the final step, the cathode is laminated in accordance with the vacuum vapor deposition. The cathode is composed of a metal. It is preferable that the thickness of the cathode is in the range of 50 to 200 nm.

A laminate (a light emitting portion) comprising the transparent electrode layer (the anode), the organic EL material layer (the hole injecting and transporting layer, the organic light emitting layer and the electron injecting layer) and the metal electrode layer (the cathode) on the transparent substrate is formed as described above.

Figure 4:
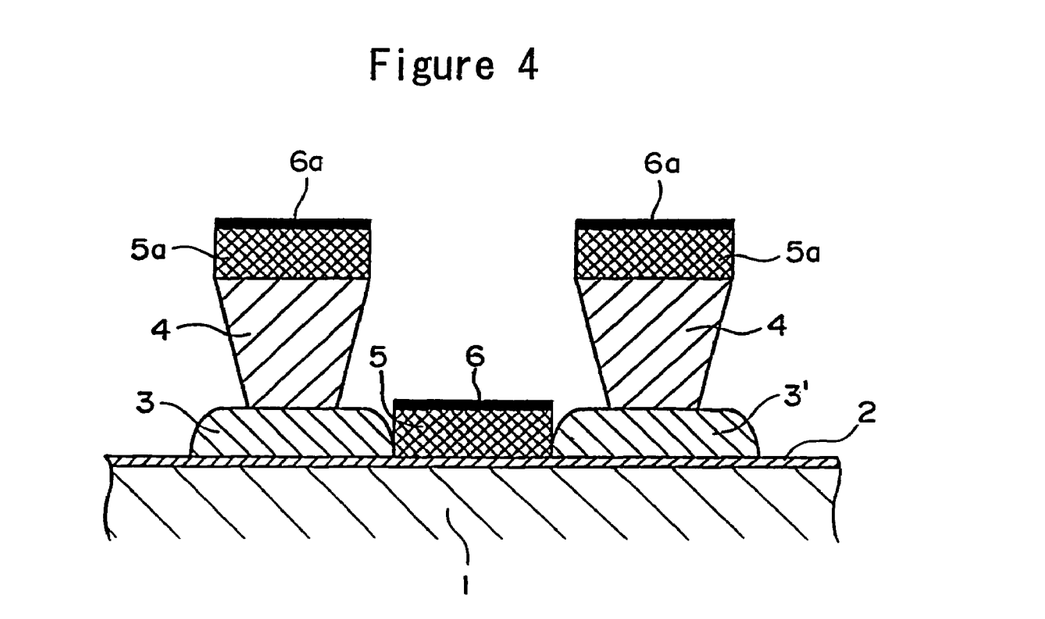
FIG. 4 shows a partial sectional view exhibiting the construction of an embodiment of the light emitting portion in the organic EL device of the present invention.

FIG. 4 shows a sectional view exhibiting the construction of an embodiment of the light emitting portion in the organic EL device of the present invention. On a transparent substrate 1 having a patterned transparent electrode layer 2, resist pattern layers (resin separation layers) 4 having a undercut pattern profile are disposed via the insulation film of the present invention 3' having the sectional shape having the width increasing towards the bottom portion. Between the resist pattern layers, an organic EL material layer 5 (having the construction in which a hole injecting and transporting layer, an organic light emitting layer and an electron injecting layer are successively formed from the side of the transparent electrode layer) having a metal electrode layer 6 on the surface is disposed and a light emitting portion is formed. On the resist pattern 4, an organic EL material layer 5a having a metal electrode layer 6a is formed due to convenience in the preparation although the organic EL material layer 5a is not necessary from the standpoint of the function.

Since the insulation film 3' has, as shown in FIG. 4, the shape having the width increasing towards the bottom portion in the above organic EL device, attachment of the metal electrode material to the transparent electrode layer 2 due to the extended deposition of the metal electrode material can be prevented during the lamination of the metal electrode layer 6 in accordance with the vacuum vapor deposition. Therefore, undesirable phenomena such as short circuit do not take place.

In addition to the above application of the insulation film of the present invention to the organic EL device, the insulation film of the present invention can also be used as a bank comprising an insulation film disposed between holes in organic EL devices which are obtained by forming organic EL material layers by injecting a macromolecular organic EL material in accordance with the ink jet method.

In the above organic EL device, the organic light emitting layer has the following functions: (1) the injecting function of injecting holes from the anode or the hole injecting and transporting layer and injecting electrons from the cathode or the electron injecting layer under application of an electric field; (2) the transporting function of transporting the injected charges (electrons and holes) by the force of the electric field; and (3) the light emitting function of providing the field for recombination of electrons and holes within the light emitting layer and leading the recombination to light emission. The type of the light emitting material used in the light emitting layer is not particularly limited and a material conventionally used as the light emitting material in organic EL devices can be used. Examples of the light emitting material include fluorescent whitening agents such as benzothiazole-based agents, benzimidazole-based agents and benzoxazole-based agents; metal chelate oxinoid compounds; styrylbenzene-based compounds; distyrylpyrazine derivatives; and aromatic dimethylidine compounds.

The hole injecting and transporting layer is a layer comprising a hole transporting compound and has the function of transporting holes injected from the anode to the light emitting layer. By disposing the hole injecting and transporting layer between the anode and the light emitting layer, a greater amount of holes are injected into the light emitting layer under a lower electric field. Moreover, electrons injected from the cathode or the electron injecting layer into the light emitting layer are accumulated in the vicinity of the interface of the light emitting layer and the hole injecting and transporting layer in the light emitting layer due to the barrier for electrons existing at the interface. Thus, the efficiency of light emission of the organic EL device is improved and the EL device exhibiting the excellent light emitting property can be prepared. The hole transporting compound used in the hole injecting and transporting layer is not particularly limited and conventional compounds used heretofore as the hole transporting compound in organic EL devices can be used. Example of the hole transporting compound include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, polysilane derivatives, aniline-based copolymers and specific electrically conductive macromolecular oligomers such as thiophene oligomers.

The electron injecting layer has the function of transporting electrons injected from the cathode to the organic light emitting layer. The electron transporting compound used in the electron injecting layer is not particularly limited and conventional compounds used heretofore as the electron transporting compound in organic EL devices can be used. Example of the electron transporting compound include nitro-substituted fluorenone derivatives, anthraquinodimethane derivatives, diphenylquinone derivatives, thiopyrane dioxide derivatives, heterocyclic tetracarboxylic acid anhydrides such as corresponding compounds having naphthalene ring or perylene ring, carbodiimides, fluorenylidene-methane derivatives, anthrone derivatives, oxadiazole derivatives and metal complexes of 8-quinolinol and derivatives thereof. Examples of the metal complex of 8-quinolinol and the derivative thereof include tris(8-quinolinol)aluminum, bis(8-quinolinol)magnesium, bis(benzo-8-quinolinol)zinc, bis(2-methyl-8-quinolylato)aluminum oxide, tris(8-quinolinol)indium, tris(5-methyl-8-quinolinol)aluminum, 8-quinolinollithium, tris(5-chloro-8-quinolinol)potassium, bis(5-chloro-8-quinolinol)potassium, tris(5,7-dichloro-8-quinolinol)aluminum, tris(5,7-dibromo-8-quinolinol)aluminum, bis(8-quinolinol)beryllium, bis(2-methyl-8-quinolinol)beryllium, bis(8-quinolinol)zinc, bis(2-methyl-8-quinolinol)zinc, bis(8-quinolinol)tin and tris(7-propyl-8-quinolinol)aluminum.

The organic light emitting layer, the hole injecting and transporting layer and the electron injecting layer may be constituted with a single layer comprising at least one material for the layer or may be a laminate of at least two layers each comprising different materials.

As the cathode, a metal electrode comprising a metal, an alloy, an electrically conductive compound or a mixture of these materials which has a small work function (4 eV or smaller) as the electrode material is used. Examples of the electrode material include sodium, sodium-potassium alloys, magnesium, lithium, magnesium-silver alloys, aluminum/aluminum oxide, indium and rare earth metals. It is preferable that the sheet resistance as the electrode is several hundred $\Omega/cm^2$ or smaller.

EXAMPLES

The present invention will be described more specifically with reference to examples in the following. However, the present invention is not limited to the examples.

Example 1

Preparation of Positive-Type Resist (A-1)

A novolak resin having a weight-average molecular weight of 5,500, which was obtained by condensation of a mixed cresol containing m-cresol and p-cresol (the ratio of the mounts by weight: 50/50) and formaline in the presence of oxalic acid as the catalyst, in an amount of 100 parts by weight, 22 parts by weight of 1,2-naphthoquinonediazide-4-sulfonic acid ester of 2,3,4-trihydroxybenzophenone (the fraction of esterification: 67% by mole), 5 parts by weight of a thermosetting imide resin "BANI-M" [a trade name; manufactured by MARUZEN SEKIYU KAGAKU Co., Ltd.] and 450 parts by weight of polyethylene glycol monomethyl ether acetate (PGMEA) were mixed. After the components were completely dissolved, the resultant solution was filtered through a membrane filter made of polytetrafluoroethylene having pores having a diameter of 0.5 $\mu$m [manufactured by MILLIPORE Company] and positive-type resist (A-1) was prepared.

Example 2

Preparation of Positive-Type Resist (A-2)

To positive-type resist (A-1) obtained in Example 1, 30 parts by weight (as pure titanium black) of titanium black treated for dispersion with a polyester-based dispersant and 106 parts by weight of PGMEA per 100 parts by weight of the novolak resin in resist (A-1) were mixed. The components were completely uniformly dispersed and positive-type resist (A-2) was prepared.

Comparative Example 1

Preparation of Positive-Type Resist (A-3)

A novolak resin having a weight-average molecular weight of 5,500, which was obtained by condensation of a mixed cresol containing m-cresol and p-cresol (the ratio of the amounts by weight: 50/50) and formaline in the presence of oxalic acid as the catalyst, in an amount of 100 parts by weight, 22 parts by weight of 1,2-naphthoquinonediazide-4-sulfonic acid ester of 2,3,4-trihydroxybenzophenone (the average fraction of esterification: 67% by mole) and 430 parts by weight of PGMEA were mixed. After the components were completely dissolved, the resultant solution was filtered through a membrane filter of polytetrafluoroethylene having pores having a diameter of 0.5 $\mu$m [manufactured by MILLIPORE Company] and positive-type resist (A-3) was prepared.

Test Example

Positive-type resist (A-1) obtained in Example 1, positive-type resist (A-2) obtained in Example 2 and positive-type resist (A-3) obtained in Comparative Example 1 were each applied to a transparent glass substrate using a spin coater each in an amount such that the formed coating film had a thickness of 1.0 $\mu$m after being dried. The prepared films were heated on a hot plate at 100° C. for 90 seconds and photoresist layers were formed.

The formed photoresist layers were exposed to light having an energy of 120 mJ/cm$^2$ using a light exposure apparatus "PLA501F" [manufactured by CANON Co., Ltd.] via a mask to obtain latent images. The exposed photoresist layers were treated by the paddle development in a 2.38% by weight aqueous solution of tetramethylammonium hydroxide for 60 seconds and resist films having a substantially rectangular sectional shape were formed.

The photoresist films were then heated on a hot plate at the temperature shown in Table 1 for 180 seconds and insulation films having a sectional shape having the width increasing towards the bottom portion were prepared. The downward increase in the sectional width [100×(b/a)$^2$, %] was obtained by using pictures of a scanning electron microscope (SEM). The results are shown in Table 1.

TABLE 1

| Positive-type | Downward increase in the sectional width | | |
|---|---|---|---|
| resist | 150° C. | 200° C. | 250° C. |
| Example 1 (A-1) | 104% | 125% | 128% |
| Example 2 (A-2) | 108% | 117% | 114% |
| Comparative Example 1 (A-3) | 149% | 219% | — |

As shown in Table 1, the insulation films of Examples 1 and 2 had much smaller downward increases in the sectional width than that of the insulation film of Comparative Example 1.

Upper edge portions of all insulation films had a round shape. The specific permittivity measured in accordance with the method of Japanese Industrial Standard C6481 was in the range of 3.3 to 3.5.

Example 3

(1) Preparation of an Insulation Film

A glass substrate of a size of 25×75×1.1 mm which had on the surface a patterned ITO transparent electrode having a thickness of 120 nm was coated with positive-type resist (A-2) obtained in Example 2 using a spin coater in an amount such that the formed film had a thickness of 1.0 $\mu$m after being dried. The coating film was heated on a hot plate at 100° C. for 90 seconds and a resist layer was formed.

The formed resist layer was exposed to light having an energy of 120 mJ/cm$^2$ using a light exposure apparatus "PLA501F" used above via a mask having a desired pattern to obtain a latent image. The exposed resist layer was treated by the paddle development in a 2.38% by weight aqueous solution of tetramethylammonium hydroxide for 60 seconds. The developed resist layer was heated on a hot plate at 200° C. for 180 seconds and an insulation film having a sectional shape having the width increasing towards the bottom portion, in which the downward increase in the sectional width was 117%, and a thickness of 1.0 $\mu$m was prepared.

(2) Formation of a Resist Pattern Having a Undercut Pattern Profile

A novolak resin having a weight-average molecular weight of 5,200, which was obtained by polycondensation of a mixed cresol containing m-cresol and p-cresol (the ratio of the amounts by weight: 60/40) with formaldehyde, in an amount of 100 parts by weight, 10 parts by weight of hexamethoxymethylated melamine, 3 parts by weight of 2-(4-methoxy-naphthyl)-4,6-bis(trichloromethyl)-s-triazine and 3 parts by weight of 4-(4-dimethylaminophenylazo) phenol were dissolved in 300 parts by weight of ethylcellosolve acetate. The resultant solution was filtered through a membrane filter and a photosensitive composition was prepared.

The glass substrate having the insulation film obtained in (1) was coated with the above composition in accordance with the spin coating. The formed coating film was heated on a hot plate at 90° C. for 60 seconds and a resist film having a thickness of 1.5 μm was formed.

The resist film was exposed to light using the light exposure apparatus "PLA501F" used above via a mask having a desired pattern and treated by the paddle development in a 0.5% by weight aqueous solution of NaOH for 60 seconds. Due to the above operation, a resist pattern having a undercut pattern profile was formed on the insulation film. The resist pattern was irradiated with light by using a high pressure mercury lamp having a brightness at 254 nm of 1.2 mW/cm$^2$ for 200 seconds to bake the resist pattern and a member for an organic EL device was prepared.

(3) Preparation of an Organic EL Device

The member for an organic EL device prepared in (2) described above was used as the substrate and fixed at a substrate holder of a commercial vapor deposition apparatus [manufactured by NIPPON SHINKU GIJUTU Co., Ltd.]. Into a boated made of molybdenum and heated by resistance, 200 mg of N,N'-bis(3-methylphenyl)-N,N'-diphenyl-[1,1'-biphenyl]-4,4'-diamine (hereinafter, referred to as TPD) was placed and 200 mg of 4,4'-bis(2,2'-diphenylvinyl) biphenyl (hereinafter, referred to as DPVBi) was placed into another boated made of molybdenum and heated by resistance. The vacuum chamber was evacuated to $1 \times 10^{-4}$ Pa.

TPD was vapor deposited at a rate of vapor deposition of 0.1 to 0.3 nm/sec by heating the boat containing TPD at 215 to 220° C. and a hole injecting and transporting layer having a thickness of 60 nm was formed. During this formation, the temperature of the substrate was kept at the room temperature. Without taking out the coated substrate, DPVBi was vapor deposited on the formed hole injecting and transporting layer at a rate of vapor deposition of 0.1 to 0.3 nm/sec by heating the boat containing DPVBi at 240° C. and a light emitting layer having a thickness of 40 nm was formed. During this formation, the temperature of the substrate was kept at the room temperature.

The resultant product was taken out of the vacuum chamber. After a mask made of stainless steel was placed on the light emitting layer formed above, the product was fixed at the substrate holder again. Into a boat made of molybdenum, 200 mg of tris(8-quinolinol)aluminum (hereinafter, referred to as Alq$_3$) was placed and 1 g of magnesium ribbon was placed into another boat made of molybdenum. Into a basket made of tungsten, 500 mg of silver wire was placed. The boats and the basket were placed into the vacuum chamber.

After the vacuum chamber was evacuated to $1 \times 10^{-4}$ Pa, Alq$_3$ was vapor deposited on the light emitting layer formed above at a rate of vapor deposition of 0.01 to 0.03 nm/sec by heating the boat containing Alq$_3$ at 230° C. and an electron injecting layer having a thickness of 20 nm was formed. On the formed electron injecting layer, silver was vapor deposited at a rate of vapor deposition of 0.1 nm/sec and, simultaneously, magnesium was vapor deposited at a rate of vapor deposition of 1.4 nm/sec. Thus, a cathode composed of a mixed metal of magnesium and silver and having a thickness of 150 nm was formed and a light emitting portion of an organic EL device shown in FIG. 4 was formed.

Then, a sealing layer was formed in accordance with the conventional process and an organic EL device was prepared.

When a direct current was applied to the device using the ITO film as the anode and the mixed metal film as the cathode, emission of blue light could be recognized in a bright environment under a voltage of 5 V or greater and the self-distinguishability was found to be very excellent.

INDUSTRIAL APPLICABILITY

The photoresist composition of the present invention comprises a thermosetting component which is cured at a specific temperature and provides the insulation film which has a sectional shape having upper edge portions having a round shape and the width increasing towards the bottom portion and is advantageous as the insulation film for organic EL devices.

By using the above insulation film, the organic EL device can be produced with stability and suppressed formation of defect products.

What is claimed is:

1. A photoresist composition for forming an insulation film for organic electroluminescence devices which comprises (A) a resin soluble in an alkali, (B) an ester of a quinonediazidesulfonic acid, (C) a thermosetting component which is curable at a temperature higher than a temperature of heat resistance of a resist film formed with the composition in accordance with photolithography, and an organic solvent, wherein the thermosetting component (C) is an imide resin.

2. A photoresist composition according to claim 1, wherein the imide resin is a thermosetting imide resin represented by general formula [1]

wherein R represents a group expressed by:

n representing an integer of 3 to 8.

3. A photoresist composition for forming an insulation film according to claim 1, which comprises 1 to 20 parts by weight of component (C) per 100 parts by weight of component (A).

4. An insulation film for organic electroluminescence devices which is formed by heating a resist film having a desired pattern and formed with a composition which comprises (A) a resin soluble in an alkali, (B) an ester of a quinonediazidesulfonic acid, (C) a thermosetting component which is curable at a temperature higher than a temperature of heat resistance of a resist film formed with the composition in accordance with photolithography, and an organic solvent, on a substrate in accordance with photolithography, has a sectional shape having upper edge portions having a round shape and a width increasing towards a bottom portion and has a thickness in a range of 0.3 to 3 μm.

5. A process for producing an insulation film for organic electroluminescence devices described in claim 4, the process comprising forming a resist film having a substantially rectangular sectional shape and a desired pattern with a photoresist composition comprising (A) a resin soluble in an alkali, (B) an ester of a quinonediazidesulfonic acid, (C) a thermosetting component which is curable at a temperature higher than a temperature of heat resistance of a resist film formed with the composition in accordance with photolithography, and an organic solvent on a substrate in accordance with photolithography and heating the formed resist film at a temperature higher than a temperature of heat resistance of the resist film so that the thermosetting component in the resist film is cured.

6. An organic electroluminescence device which comprises an insulation film described in claim 4.

7. A process for producing an insulation film for organic electroluminescence devices, the process comprising forming a resist film using a photoresist composition comprising (A) a resin soluble in an alkali, (B) an ester of a quinonediazidesulfonic acid, (C) a thermosetting component that is an imide resin and which is curable at a temperature higher than a temperature of heat resistance of a resist film formed with the composition in accordance with photolithography, and an organic solvent on a substrate in accordance with photolithography and heating the formed resist film at a temperature higher than a temperature of heat resistance of the resist film so that the thermosetting component in the resist film is cured.

8. A photoresist composition according to claim 1, wherein (B) the ester of a quinonediazidesulfonic acid comprises at least a compound obtained by converting a specific fraction of a phenolic hydroxyl group in a polyphenol compound selected from the group consisting of 2,3,4-trihydroxybenzophenone, 2,4,4'-trihydroxybenzophenone, 2,3,4,4'-tetrahydroxybenzophenone, 2,4,2',4'-tetrahydoxybenzophenone and 2,3,4,2',4'-pentahydroxybenzophenone into an ester selected from the group consisting of an ester of 1,2-naphthoquinonediazide-5-sulfonic acid and an ester of 1,2-naphthoquinone-diazide-4-sulfonic acid.

9. A photoresist composition according to claim 8, wherein the ester of a quinonediazidesulfonic acid comprises a compound obtained by converting a specific fraction of a phenolic hydroxyl group in the polyphenol compound into an ester of 1,2-naphthoquinone-diazide-4-sulfonic acid.

10. A photoresist composition for forming an insulation film according to claim 2, which comprises 1 to 20 parts by weight of component (C) per 100 parts by weight of component (A).

11. A photoresist composition for forming an insulation film according to claim 9, which comprises 1 to 20 parts by weight of component (C) per 100 parts by weight of component (A).

12. An insulation film for organic electroluminescence devices which is formed by heating a resist film having a desired pattern and formed with a composition described in claim 3 on a substrate in accordance with photolithography, has a sectional shape having upper edge portions having a round shape and a width increasing towards a bottom portion and has a thickness in a range of 0.3 to 3 μm.

13. An insulation film for organic electroluminescence devices which is formed by heating a resist film having a desired pattern and formed with a composition described in claim 10 on a substrate in accordance with photolithography, has a sectional shape having upper edge portions having a round shape and a width increasing towards a bottom portion and has a thickness in a range of 0.3 to 3 μm.

14. An insulation film for organic electroluminescence devices which is formed by heating a resist film having a desired pattern and formed with a composition described in claim 11 on a substrate in accordance with photolithography, has a sectional shape having upper edge portions having a round shape and a width increasing towards a bottom portion and has a thickness in a range of 0.3 to 3 μm.

15. A process for producing an insulation film for organic electroluminescence devices, the process comprising forming a resist film having a substantially rectangular sectional shape and a desired pattern with a photoresist composition described in claim 3 on a substrate in accordance with photolithography and heating the formed resist film at a temperature higher than a temperature of heat resistance of the resist film so that the thermosetting component in the resist film is cured.

16. A process for producing an insulation film for organic electroluminescence devices, the process comprising forming a resist film having a substantially rectangular sectional shape and a desired pattern with a photoresist composition described in claim 10 on a substrate in accordance with photolithography and heating the formed resist film at a temperature higher than a temperature of heat resistance of the resist film so that the thermosetting component in the resist film is cured.

17. A process for producing an insulation film for organic electroluminescence devices, the process comprising forming a resist film having a substantially rectangular sectional shape and a desired pattern with a photoresist composition described in claim 11 on a substrate in accordance with photolithography and heating the formed resist film at a temperature higher than a temperature of heat resistance of the resist film so that the thermosetting component in the resist film is cured.

18. An organic electroluminescence device which comprises an insulation film described in claim 12.

19. An organic electroluminescence device which comprises an insulation film described in claim 13.

20. An organic electroluminescence device which comprises an insulation film described in claim 14.

* * * * *